(12) United States Patent
Cheng et al.

(10) Patent No.: US 10,155,656 B2
(45) Date of Patent: Dec. 18, 2018

(54) INTER-POLY CONNECTION FOR PARASITIC CAPACITOR AND DIE SIZE IMPROVEMENT

(71) Applicant: Taiwan Semiconductor Manufacturing Co., Ltd., Hsin-Chu (TW)

(72) Inventors: Shyh-Wei Cheng, Zhudong Township (TW); Chih-Yu Wang, Taichung (TW); Hsi-Cheng Hsu, Taichung (TW); Ji-Hong Chiang, Changhua (TW); Jui-Chun Weng, Taipei (TW); Shiuan-Jeng Lin, Hsinchu (TW); Wei-Ding Wu, Zhubei (TW); Ching-Hsiang Hu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/980,297

(22) Filed: Dec. 28, 2015

(65) Prior Publication Data
US 2017/0107097 A1 Apr. 20, 2017

Related U.S. Application Data

(60) Provisional application No. 62/243,376, filed on Oct. 19, 2015.

(51) Int. Cl.
*B81B 7/00* (2006.01)
*B81C 1/00* (2006.01)

(52) U.S. Cl.
CPC ............ *B81B 7/007* (2013.01); *B81B 7/0006* (2013.01); *B81C 1/00238* (2013.01);
(Continued)

(58) Field of Classification Search
CPC ............ B81B 7/007; B81B 2207/012; B81B 2207/096; B81C 1/00301; B81C 2201/013; B81C 2203/037; B81C 2203/0792
See application file for complete search history.

(56) References Cited

U.S. PATENT DOCUMENTS

2002/0166838 A1\* 11/2002 Nagarajan ........... G01P 15/0802
216/2
2007/0035001 A1 2/2007 Kuhmann et al.
(Continued)

FOREIGN PATENT DOCUMENTS

| CN | 102583220 A | 7/2012 |
| CN | 102751172 A | 10/2012 |
| CN | 104733371 A | 6/2015 |

OTHER PUBLICATIONS

Fischer, et al. "Integrating MEMS and ICs." Microsystems and Nanoengineering 1, article No. 15005 (2015. Published May 28, 2015.

*Primary Examiner* — Brigitte A Paterson
(74) *Attorney, Agent, or Firm* — Eschweiler & Potashnik, LLC (57) ABSTRACT

The present disclosure relates to micro-electromechanical system (MEMS) package that uses polysilicon inter-tier connections to provide for a low parasitic capacitance in MEM device signals, and a method of formation. In some embodiments, the MEMS package has a CMOS substrate with one or more semiconductor devices arranged within a semiconductor body. A MEMS substrate having an ambulatory element is connected to the CMOS substrate by a conductive bonding structure. The conductive bonding structure is arranged on a front-side of the MEMS substrate at a location laterally offset from the ambulatory element. One or more polysilicon vias extend through the conductive (Continued)

MEMS substrate to the bonding structure. The one or more polysilicon vias are configured to electrically couple the MEMS substrate to the CMOS substrate. By connecting the MEMS substrate to the CMOS substrate using the polysilicon vias, the parasitic capacitance and form factor of the MEMS package are reduced.

20 Claims, 8 Drawing Sheets

(52) U.S. Cl.
CPC .... *B81C 1/00301* (2013.01); *B81B 2207/012* (2013.01); *B81B 2207/096* (2013.01); *B81C 2201/013* (2013.01); *B81C 2203/0109* (2013.01); *B81C 2203/0118* (2013.01); *B81C 2203/037* (2013.01); *B81C 2203/0792* (2013.01)

(56) References Cited

U.S. PATENT DOCUMENTS

| | | |
|---|---|---|
| 2008/0164542 A1 | 7/2008 | Yang et al. |
| 2008/0169515 A1 | 7/2008 | Hwang |
| 2009/0134459 A1* | 5/2009 | Goto .................. B81C 1/00246 257/347 |
| 2010/0284553 A1* | 11/2010 | Conti .................. B81B 7/0061 381/174 |
| 2012/0049299 A1* | 3/2012 | Chou .................. B81C 1/00246 257/417 |
| 2012/0142144 A1 | 6/2012 | Taheri |
| 2013/0277771 A1* | 10/2013 | Chou .................. G01P 15/125 257/415 |
| 2014/0248731 A1* | 9/2014 | Huang ................. B81B 7/0064 438/50 |
| 2015/0158716 A1 | 6/2015 | Cheng et al. |
| 2016/0119722 A1 | 4/2016 | Chu et al. |

\* cited by examiner

INTER-POLY CONNECTION FOR PARASITIC CAPACITOR AND DIE SIZE IMPROVEMENT

REFERENCE TO RELATED APPLICATION

This Application claims priority to U.S. Provisional Application No. 62/243,376 filed on Oct. 19, 2015, the contents of which are incorporated by reference in their entirety.

BACKGROUND

In the past decade, micro-electromechanical system (MEMS) devices have become increasingly common in electronic devices (e.g., cell phones, sensors, etc.). MEMS devices include mechanical and electrical features that are able to that sense physical forces or quantities (e.g., acceleration, radiation, etc.) and/or control physical quantities (e.g., fluids). Examples of MEMS devices include microsensors, which convert mechanical signals into electrical signals, and micro-actuators, which convert electrical signals into mechanical signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, the semiconductor industry has begun to fabricate MEMS devices using semiconductor device fabrication methods. This has enabled MEMS devices to be electrically connected to integrated circuits (ICs) to form complete MEMS systems. The MEMS devices are configured to sense or control physical, optical, or chemical quantities, while the ICs provide signal processing functionalities for electrical signals output from the MEMS devices (e.g., analog-to-digital conversion, amplification, filtering, information processing, etc.).

Typically, MEMS devices and ICs may be formed in system-in-packages (SIPs), which stack an IC and one or more MEMS devices onto one another and make connections therebetween using wire bond connections. However, it has been appreciated that such SIP configurations have a number of drawbacks. For example, the wire bond connections cause SIPs to have a relatively large form factor (i.e., size) that decreases device density and increases cost. Furthermore, the wire bond connections used in SIPs contribute a parasitic capacitance to signals output from a MEMS device. The parasitic capacitance reduces signal quality of MEMS devices using capacitive sensing, and thereby may degrade performance of the MEMS devices.

The present disclosure relates to micro-electromechanical system (MEMS) package that uses polysilicon inter-tier connections to provide for a low parasitic capacitance between a MEM device and an integrated circuit, and a method of formation. In some embodiments, the MEMS package comprises a CMOS substrate having one or more semiconductor devices arranged within a semiconductor body. A MEMS substrate having an ambulatory element is connected to the CMOS substrate by a conductive bonding structure. The conductive bonding structure is arranged on a front-side of the MEMS substrate at a location that is laterally offset from the ambulatory element. One or more polysilicon vias extend through the conductive MEMS substrate to the bonding structure. The one or more polysilicon vias are configured to electrically couple the MEMS substrate to the CMOS substrate. By connecting the MEMS substrate to the CMOS substrate using the polysilicon vias, the parasitic capacitance and form factor of the MEMS package are reduced.

Figure 1:
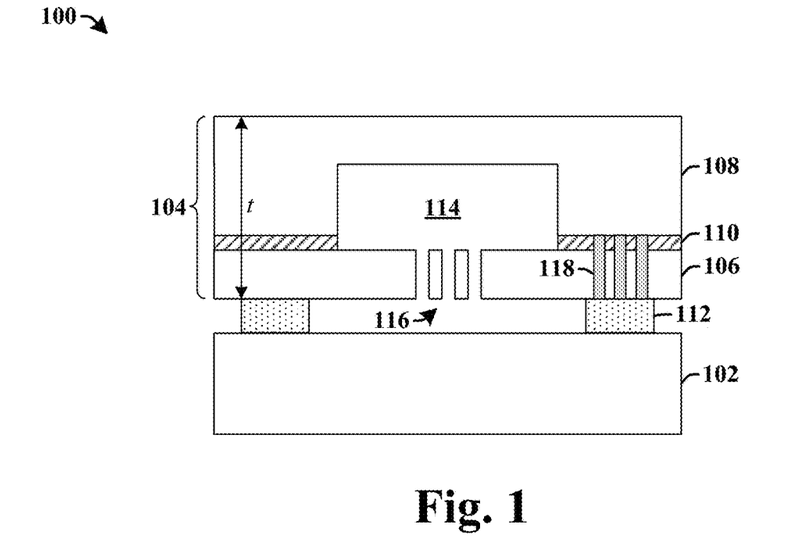
FIG. 1 illustrates some embodiments of a cross-sectional view of a micro-electromechanical system (MEMS) package having an inter-tier polysilicon connection.

FIG. 1 illustrates some embodiments of a cross-sectional view of a MEMS package 100 having an inter-tier polysilicon connection.

The MEMS (micro-electromechanical system) package 100 comprises a CMOS substrate 102 and a MEMS structure 104. The CMOS substrate 102 comprises an integrated chip having a plurality of semiconductor devices (e.g., transistors, capacitors, resistors, inductors, and diodes) configured to support operation of the MEMS structure 104. The MEMS structure 104 comprises one or more MEMS devices (e.g., a motion sensor, a pressure sensor, a microphone, a gyroscope, etc.).

The MEMS structure 104 comprises a MEMS substrate 106 and a capping substrate 108. The capping substrate 108 has a depression within a surface facing the MEMS substrate 106. The capping substrate 108 is bonded to the MEMS substrate 106 by way of an adhesive layer 110 to form a cavity 114 arranged between the MEMS substrate 106 and the capping substrate 108. The MEMS substrate 106 comprises an ambulatory element 116 (e.g., a proof mass, a flexible membrane, etc.) arranged within the cavity 114. The ambulatory element 116 is configured to move within the cavity 114 in response to an external stimuli (e.g., a motion of the MEMS package 100, a sound wave, a change in pressure, etc.) and to generate an electrical output signal that correlates to the external stimuli. In some embodiments, the adhesive layer 110 may comprise a dielectric layer (e.g., an oxide layer) that facilitates a fusion bond between the MEMS substrate 106 and the capping substrate 108.

The MEMS structure 104 is electrically coupled to the CMOS substrate 102 by way of one or more electrically conductive inter-tier polysilicon connections 118. The inter-tier polysilicon connections 118 extend through the MEMS substrate 106 to a conductive bonding structure 112 arranged on the CMOS substrate 102. In some embodiments, the inter-tier polysilicon connections 118 may further extend through the adhesive layer 110 to contact the capping substrate 108. The inter-tier polysilicon connections 118 comprise a doped polysilicon material that is electrically conductive, thereby forming an electrical connection between the MEMS structure 104 and the CMOS substrate 102.

The inter-tier polysilicon connections 118 provide for a short connection distance between the MEMS structure 104 and the CMOS substrate 102. The short connection distance results in a relatively small parasitic capacitance that improves performance (e.g., by reducing noise of a signal received from the MEMS structure 104). Furthermore, polysilicon has a similar crystalline structure to the MEMS substrate 106, which causes the inter-tier polysilicon connections 118 to induce a relatively small stress on the MEMS substrate 106 (e.g., in comparison to inter-tier metal connections, which stress the MEMS substrate and thereby induce warpage and/or damage to the MEMS substrate). This allows for the MEMS substrate 106 to have a small thickness t that further improves a form factor and reduces a parasitic capacitance of the MEMS package 100 (e.g., in some embodiments, the MEMS structure 104 may have a thickness t that is less than or equal to approximately 10 mm).

Figure 2:
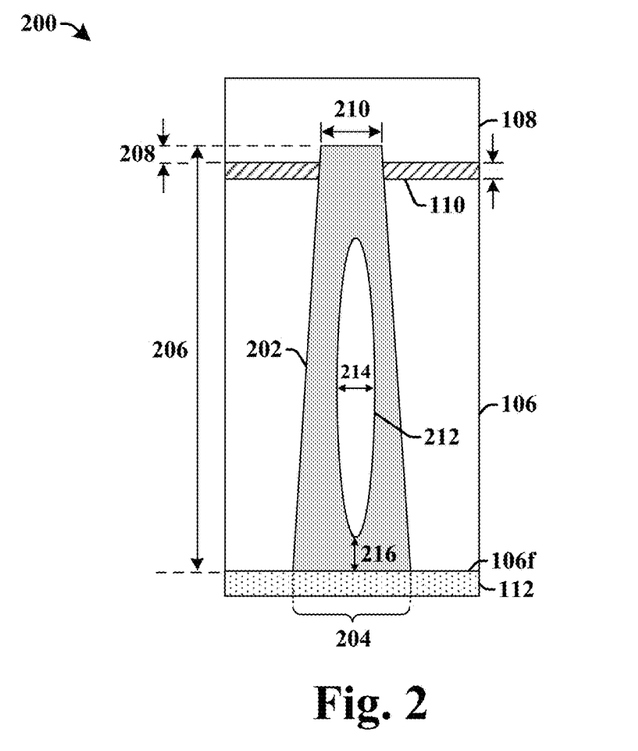
FIG. 2 illustrates some additional embodiments of a cross-sectional view of an inter-tier polysilicon connection arranged within a MEMS substrate.

FIG. 2 illustrates a cross-sectional view of some embodiments of a substrate 200 having a polysilicon inter-tier connection comprising a polysilicon via arranged within a MEMS substrate.

The substrate 200 comprises a polysilicon via 202 arranged within a trench 204 extending through a MEMS substrate 106. In some embodiments, the polysilicon via 202 may vertically extend from a capping substrate 108 to a conductive bonding structure 112 electrically coupled to a CMOS substrate (not shown). In some embodiments, the trench 204 may have a height 206 that is in a range of between approximately 20 microns (um) and approximately 40 um. In some embodiments, the polysilicon via 202 may extend to within a recess within the capping substrate 108.

For example, the polysilicon via 202 may extend within the capping substrate 108 to a distance 208 that is in a range of between approximately 1 um and approximately 5 um.

The polysilicon via 202 has tapered sidewalls. In some embodiments, the tapered sidewalls may directly contact the MEMS substrate 106. As stated above, because of the crystalline structure of the polysilicon via 202, the polysilicon via 202 is able to directly contact the MEMS substrate 106 without substantially stressing the MEMS substrate 106. The tapered sidewalls cause a width 210 of the polysilicon via 202 to decrease as a distance from the conductive bonding structure 112 increases. For example, the polysilicon via 202 has a smaller width at a location that abuts adhesive layer 110 than at a location within the MEMS substrate 106.

In some embodiments, the polysilicon via 202 may comprise a polysilicon material surrounding a void 212 (e.g., an air-gap). The void 212 may have a width 214 that is between one-third and one-half of a width 210 of the trench 204. For example, the width 214 of the void 212 may be in a range of between approximately 0.5 um and approximately 2 um and the trench 204 may have a width in a range of between approximately 1 um and approximately 5 um. In some embodiments, the void 212 is vertically offset from lateral surfaces of the MEMS substrate 106. For example, the void 212 may be located a distance 216 that is in a range of between approximately 1 um and approximately 5 um below surface 106f of the MEMS substrate 106. In other embodiments, the void 212 may extend to a position that contacts the conductive bonding structure 112.

Figure 3:
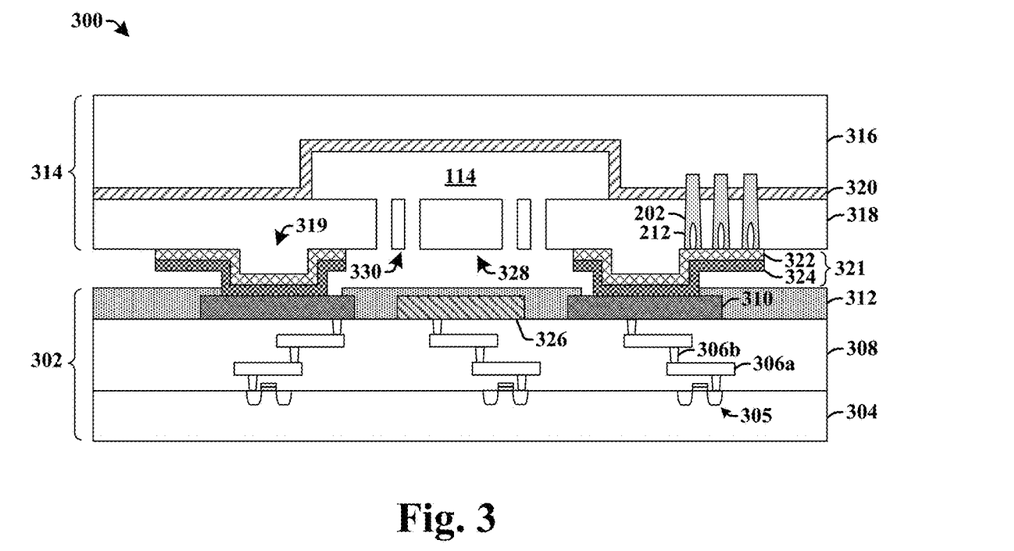
FIG. 3 illustrates some additional embodiments of a cross-sectional view of a MEMS package having an inter-tier polysilicon connection.

FIG. 3 illustrates some embodiments of a cross-sectional view of a MEMS package 300 having an inter-tier polysilicon connection.

The MEMS package 300 comprises a CMOS substrate 302 and a MEMS structure 314. The CMOS substrate 302 comprises a semiconductor body 304 and an overlying BEOL metallization stack. A plurality of transistor devices 305 (e.g., CMOS transistors) are arranged within the semiconductor body 304. The plurality of transistor devices 305 are configured to provide such functions as analog-to-digital conversion, amplification, storage, filtering, etc. The BEOL metallization stack comprises a plurality of metal interconnect layers, 306a and 306b, arranged within a dielectric structure 308 having a plurality of inter-level dielectric (ILD) layers. In some embodiments, the plurality of metal interconnect layers comprise alternating layers of metal interconnect wires 306a and metal vias 306b. In various embodiments, the plurality of ILD layers may comprise a low-k dielectric layer (e.g., SiCO), an ultra low-k dielectric layer, and/or an oxide, for example. In various embodiments, the plurality of metal interconnect layers may comprise copper, aluminum, or tungsten, for example.

The plurality of metal interconnect layers, 306a and 306b, connect one or more of the plurality of transistor devices 307 to one or more conductive bond pads 310 located along an upper surface of the CMOS substrate 302. The conductive bond pads 310 may comprise aluminum, for example. In some embodiments, the plurality of metal interconnect layers, 306a and 306b, may also connect one or more of the plurality of transistor devices 307 to one or more capacitive sensing electrodes 326 arranged on the CMOS substrate 302. In some embodiments, a dielectric material 312 is laterally arranged between the conductive bond pads 310 and/or the one or more capacitive sensing electrodes 326.

The MEMS structure 314 comprises a MEMS substrate 318 and a capping substrate 316. In some embodiments, the MEMS substrate 318 comprises a conductive material. For example, in some embodiments, the MEMS substrate 318 may comprise a silicon substrate doped to have a p-type doping or an n-type doping. In other embodiments, the MEMS substrate 318 may comprise polysilicon. The capping substrate 316 comprises a silicon substrate. The MEMS substrate 318 is coupled to the capping substrate 316 by way of a dielectric layer 320 (e.g., an oxide).

The capping substrate 316 comprises a cavity 114 arranged within a side of the capping substrate 316 facing the MEMS substrate 318. The MEMS substrate 318 comprises an ambulatory element 116 in communication with the cavity 114. In some embodiments, the ambulatory element 328 may be connected to one or more springs 330, which allow the ambulatory element 328 to move in response to motion of the MEMS package 300. In some embodiments, the dielectric layer 320 lines inner surfaces of the cavity 114. In some embodiments, the capping substrate 316 further includes anti-stiction bumps (not shown) arranged within the cavity 114 and configured to reduce stiction between the capping substrate 316 and the ambulatory element 116.

The ambulatory element 328 is configured to move in response to an external stimuli (e.g., a motion of the MEMS package 300, a sound wave, a change in pressure, etc.). The movement of the ambulatory element 328 causes a capacitance relating to the ambulatory element 328 to change in a manner that correlates to the external stimuli. For example, in some embodiments, movement of the ambulatory element 328 may change a capacitance measured between the ambulatory element 328 and the capacitive sensing electrodes 326. In other embodiments, movement of the ambulatory element 328 may change a capacitance measured between different parts of the MEMS substrate 318.

Polysilicon vias 202 extend through the MEMS substrate 318 from the capping substrate 316 to a conductive bonding structure 321 arranged between the MEMS substrate 318 and the conductive bond pads 310. The polysilicon vias 202 are configured to electrically couple the MEMS structure 314 to the underlying CMOS substrate 302. In some embodiments, the polysilicon vias 202 may comprise multiple polysilicon vias 202 arranged in parallel between the MEMS substrate 318 and the conductive bonding structure 321. In some embodiments, the polysilicon vias 202 may comprise a void 212 arranged along an upper surface of the polysilicon vias 202. In such embodiments, the conductive bonding structure 321 may extend into the void 212.

In some embodiments, the conductive bonding structure 321 may comprise a conductive routing layer 322 and a eutectic bonding layer 324. In some embodiments, the conductive routing layer 322 may comprise doped polysilicon. The eutectic bonding layer 324 is arranged between the conductive routing layer 322 and the conductive bond pads 310. In some embodiments, the eutectic bonding layer 324 may comprise aluminum or germanium. In some embodiments, sidewalls of the conductive routing layer 322 may be aligned with sidewalls of the eutectic bonding layer 324.

In some embodiments, the conductive routing layer 322 laterally extends from a location contacting the one or more polysilicon vias 202 to a location overlying one or more protrusions 319 that extend vertically outward from a backside of the MEMS substrate 318. In some embodiments, the polysilicon vias 202 may be arranged along a same side of a protrusion 319. In some embodiments, the polysilicon vias 202 may be arranged adjacent to a subset (i.e., not all) of the protrusions 319.

Figure 4:
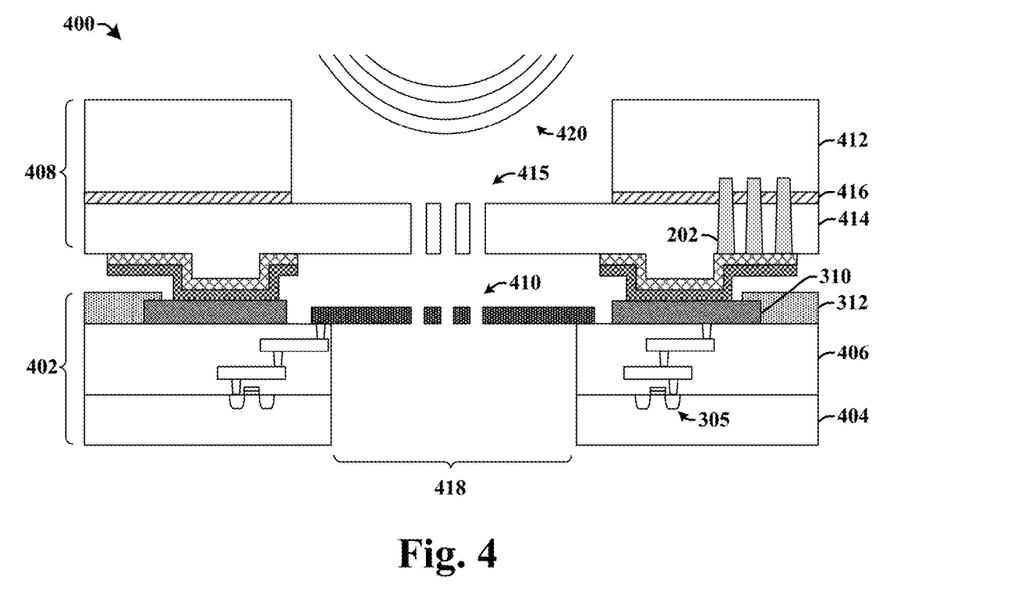
FIG. 4 illustrates some embodiments of a MEMS microphone comprising an inter-tier polysilicon connection.
Figure 5:
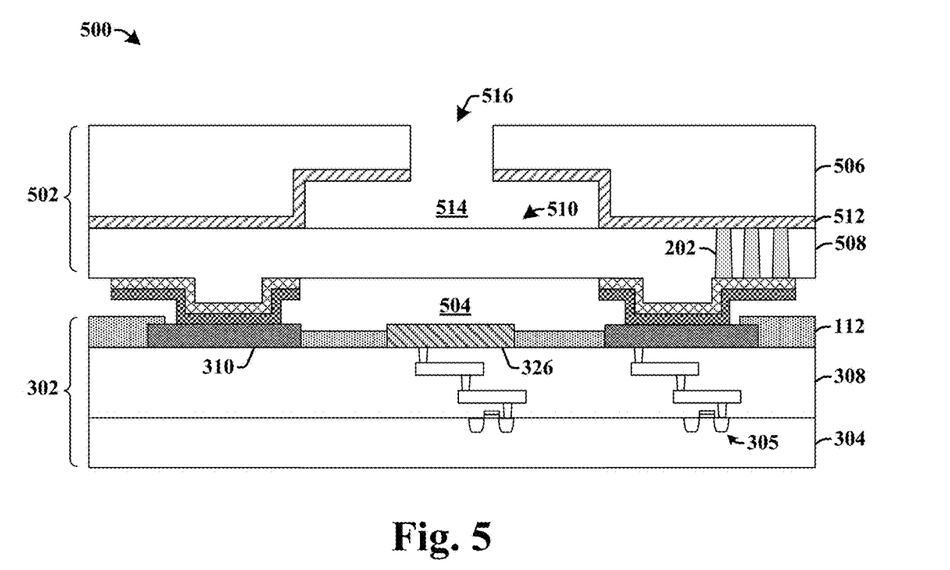
FIG. 5 illustrates some embodiments of a MEMS pressure sensor comprising an inter-tier polysilicon connection.

FIGS. 4-5 illustrate some more detailed examples of MEMS devices having inter-tier polysilicon connections.

Although FIGS. 4-5 illustrates specific types of MEMS devices, it will be appreciated that the inter-tier polysilicon connections are not limited to such devices, but rather may be used with any type of MEMS device (e.g., a gyroscope, a motion sensor, etc.).

FIG. 4 illustrates some embodiments of a MEMS microphone 400 comprising inter-tier polysilicon connections.

The MEMS microphone 400 comprises a cavity 418 extending through a CMOS substrate 402 (e.g., through semiconductor body 404 and dielectric layer 406) and a MEMS structure 408 (e.g., through capping substrate 412 and dielectric layer 416). The MEMS structure 408 comprises a MEMS substrate 414 having a conductive diaphragm 415 arranged in the cavity 418 at a position above a conductive back-plate 410 (e.g., a polysilicon back-plate arranged on the CMOS substrate 402). The MEMS structure 408 and the CMOS substrate 402 are electrically connected by polysilicon vias 202 vertically extending through the MEMS substrate 414. The polysilicon vias 202 form an electrical connection between the conductive diaphragm 415 and the CMOS substrate 402.

During microphone operation, sound in the form of a time-varying pressure wave 420 strikes the conductive diaphragm 415, thereby causing small displacements in the conductive diaphragm 415 relative to the conductive back-plate 410. The magnitude and frequency of the displacements correspond to a volume and pitch of the time-varying pressure wave 420. To convert these displacements into an electrical signal, devices within the CMOS substrate 402 measure the time-varying capacitance between the conductive diaphragm 415 and the conductive back-plate 410.

FIG. 5 illustrates some embodiments of a MEMS pressure sensor 500 comprising inter-tier polysilicon connections.

The MEMS pressure sensor 500 comprises a MEMS structure 502 arranged over a CMOS substrate 302. The MEMS structure 502 comprises a MEMS substrate 508 that is bonded to a capping substrate 506 by way of a dielectric layer 512. The MEMS substrate 508 comprises an ambulatory element 510 comprising a deflectable diaphragm extending over a hermetically sealed chamber 504 arranged between the CMOS substrate 302 and the MEMS substrate 508. A cavity 514 is arranged between the MEMS substrate 508 and the capping substrate 506. The cavity 514 is in communication with an ambient environment by way of an opening 516 extending through the capping substrate 506 and the dielectric layer 512.

The MEMS structure 502 and the CMOS substrate 302 are electrically connected by polysilicon vias 202 vertically extending through the MEMS substrate 508. The polysilicon vias 202 form an electrical connection between the ambulatory element 510 and the CMOS substrate 302. During operation of the MEMS pressure sensor 500, a pressure within the cavity 514 will cause the ambulatory element 510 to move depending on a relationship between the pressure and a reference pressure within the hermetically sealed chamber 504. As the ambulatory element 510 moves a capacitance between the ambulatory element 510 and a capacitive sensing electrode 326 changes, thereby indicating a change in a pressure of the ambient environment.

FIGS. 6-15 illustrate some embodiments of cross-sectional views 600-1500 showing a method of forming a micro-electromechanical system (MEMS) package having an inter-tier polysilicon connection.

Figure 6:
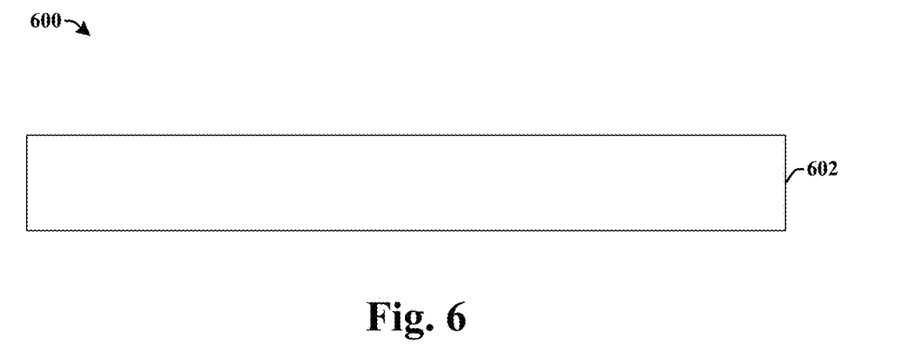
FIGS. 6-15 illustrate some embodiments of cross-sectional views showing a method of forming a micro-electromechanical system (MEMS) package having an inter-tier polysilicon connection.

As shown in cross-sectional view 600 of FIG. 6, a capping substrate 602 is provided. In various embodiments, the capping substrate 602 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

Figure 7:
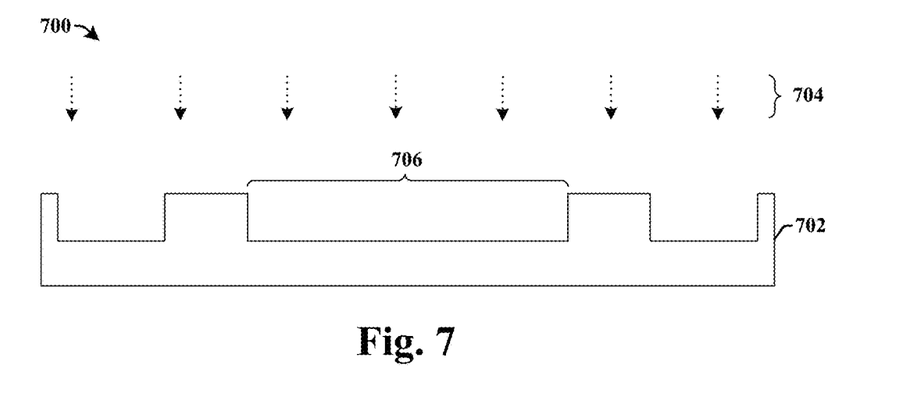

As shown in cross-sectional view 700 of FIG. 7, the capping substrate 702 is selectively exposed to a first etchant 704 configured to form one or more depressions 706 within the capping substrate 702. In some embodiments, the capping substrate 702 may be etched according to a first masking layer (not shown). In various embodiments, the first masking layer may comprise photoresist or a nitride (e.g., SiN) patterned using a photolithography process. In various embodiments, the first etchant 704 may comprise a dry etchant have an etching chemistry comprising a fluorine species (e.g., $CF_4$, $CHF_3$, $C_4F_8$, etc.) or a wet etchant (e.g., hydroflouric acid (HF) or Tetramethylammonium hydroxide (TMAH)).

Figure 8:
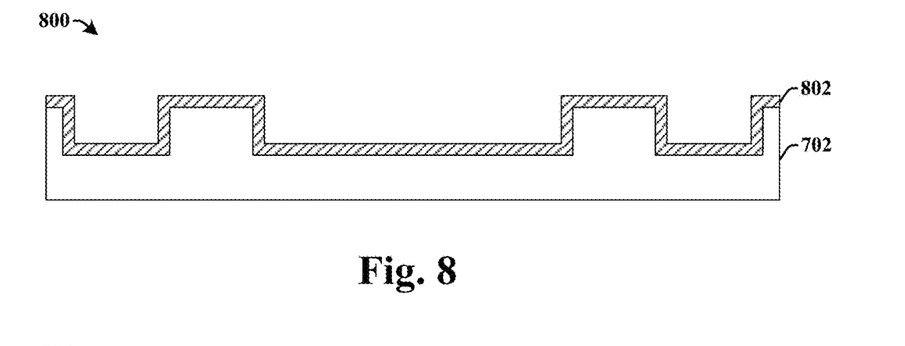

As shown in cross-sectional view 800 of FIG. 8, a dielectric layer 802 (e.g., $SiO_2$) is formed over the capping substrate 702. In some embodiments, the dielectric layer 802 comprises an oxide (e.g., $SiO_2$) formed by way of a thermal process. In other embodiments, the dielectric layer 802 comprises an oxide (e.g., $SiO_2$) formed by way of a deposition process (e.g., chemical vapor deposition (CVD), physical vapor deposition (PVD), atomic layer deposition (ALD), etc.).

Figure 9:
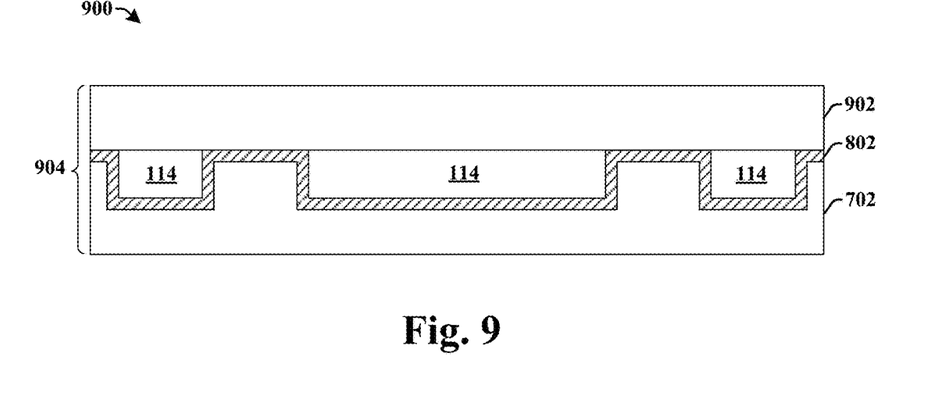

As shown in cross-sectional view 900 of FIG. 9, a MEMS substrate 902 is bonded to the dielectric layer 802 to form a MEMS structure 904. In some embodiments, the bonding process may comprise a fusion bonding process. In some embodiments, the MEMS substrate 902 may comprise a silicon substrate having a doping concentration that makes the MEMS substrate 902 conductive (e.g., having a p-type doping concentration). In other embodiments, the MEMS substrate 902 may comprise polysilicon. Bonding the MEMS substrate 902 to the dielectric layer 802 forms one or more cavities 114 arranged between the capping substrate 702 and the MEMS substrate 902.

Figure 10:
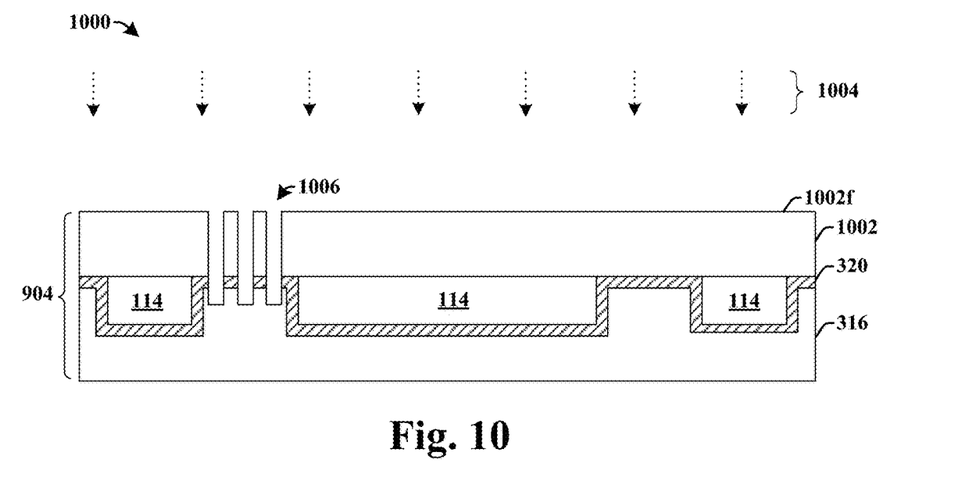

As shown in cross-sectional view 1000 of FIG. 10, the MEMS substrate 1002 is selectively exposed to a second etchant 1004 to form a plurality of trenches 1006 within the MEMS substrate 1002. The plurality of trenches 1006 may vertically extend from a front-side 1002f of the MEMS substrate 1002 to within the capping substrate 316. In some embodiments, the MEMS substrate 1002 may be etched according to a second masking layer (not shown). In various embodiments, the second masking layer may comprise photoresist or a nitride (e.g., SiN) patterned using a photolithography process. In various embodiments, the second etchant 1004 may comprise a dry etchant have an etching chemistry comprising a fluorine species (e.g., $CF_4$, $CHF_3$, $C_4F_8$, etc.) or a wet etchant (e.g., HF or TMAH).

Figure 11:
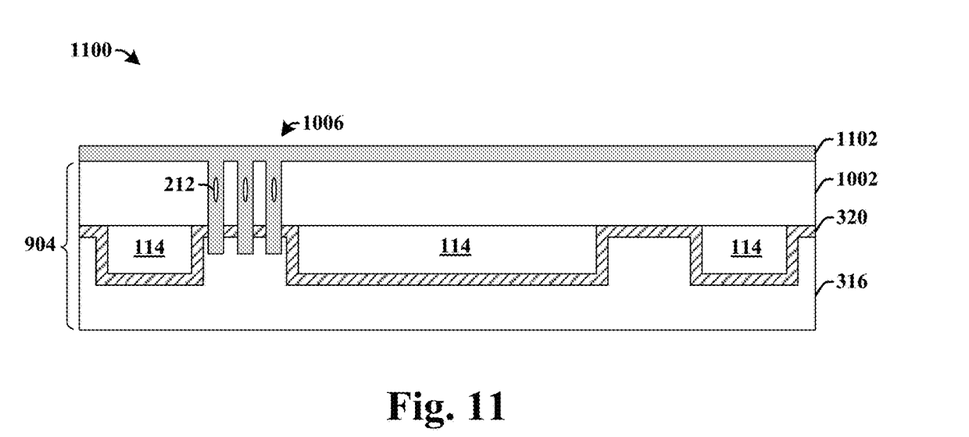

As shown in cross-sectional view 1100 of FIG. 11, the plurality of trenches 1006 are filled with a doped polysilicon material 1102. The doped polysilicon material 1102 may extend over a back-side of the MEMS substrate 1002. The doped polysilicon material 1102 may be formed by way of a deposition process (e.g., chemical vapor deposition (CVD), physical vapor deposition (PVD), atomic layer deposition (ALD), etc.). In some embodiments, the doped polysilicon is deposited within the plurality of trenches 1006 in a manner that forms void 212 within the doped polysilicon material 1102. In some embodiments, a planarization process may be performed after depositing the doped polysilicon material 1102 to form a plurality of polysilicon vias 202 by removing the doped polysilicon material 1102 disposed outside of the plurality of trenches 1006. In some embodiments, the planarization process may comprise a chemical mechanical polishing (CMP) process.

Figure 12:
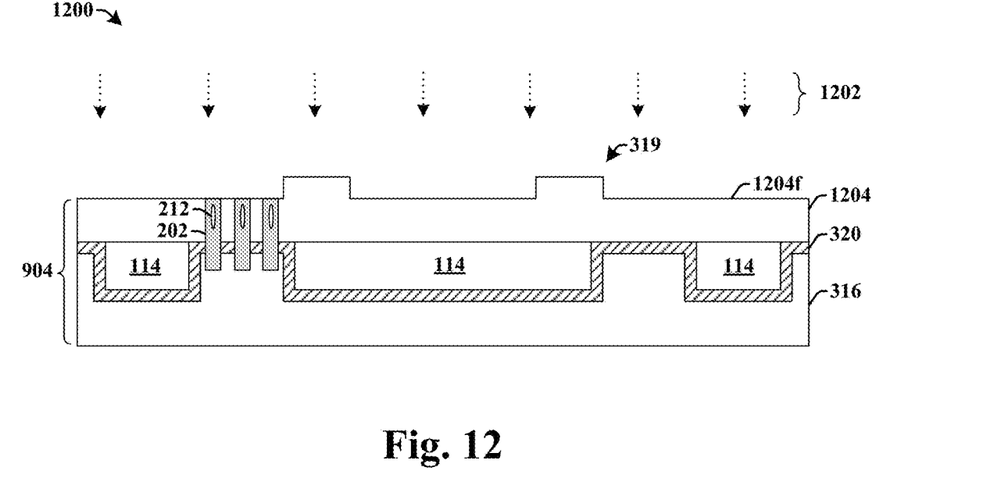

As shown in cross-sectional view 1200 of FIG. 12, a plurality of protrusions 319 are formed on a front-side 1204f of the MEMS substrate 1204. In some embodiments, the front-side 1204f of the MEMS substrate 1204 may be exposed to a third etchant 1202 according to a third masking layer (now shown). In some embodiments, the plurality of protrusions 319 are laterally offset from the plurality of polysilicon vias 202. In some embodiments, the etching process used to form the plurality of protrusions 319 removes polysilicon overlying the voids 212, so that the voids within the polysilicon vias 202 are exposed, thereby forming a recess within a surface of the one or more polysilicon vias 202.

Figure 13:
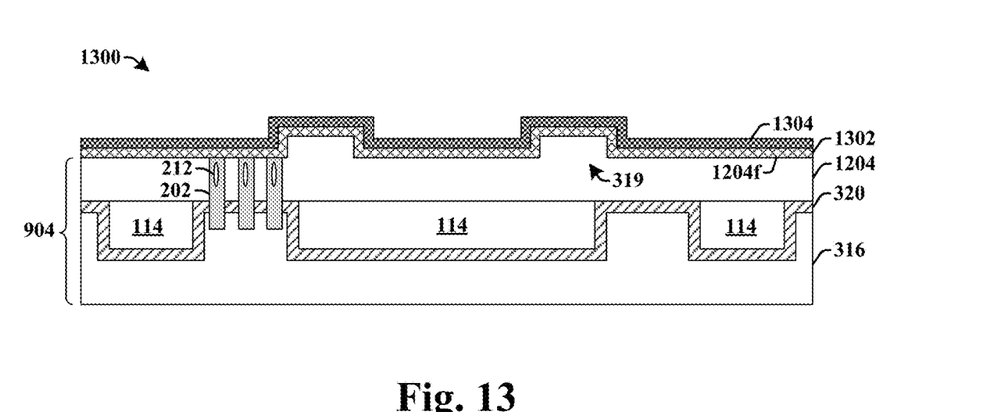

As shown in cross-sectional view 1300 of FIG. 13, a conductive routing layer 1302 is formed over the front-side 1204f of the MEMS substrate 1204. The conductive routing layer 1302 may comprise a doped polysilicon material that extends over the one or more polysilicon via 202 and the plurality of protrusions 319. The conductive routing layer 1302 may be formed by way of a deposition process (e.g., chemical vapor deposition (CVD), physical vapor deposition (PVD), atomic layer deposition (ALD), etc.).

A eutectic bonding layer 1304 is formed over the conductive routing layer 1302. In various embodiments, the eutectic bonding layer 1304 comprises a germanium layer or an aluminum layer arranged over the conductive routing layer 1302. In various embodiments, the eutectic bonding layer 1304 may be formed by way of a deposition process (e.g., chemical vapor deposition (CVD), physical vapor deposition (PVD), atomic layer deposition (ALD), etc.).

Figure 14:
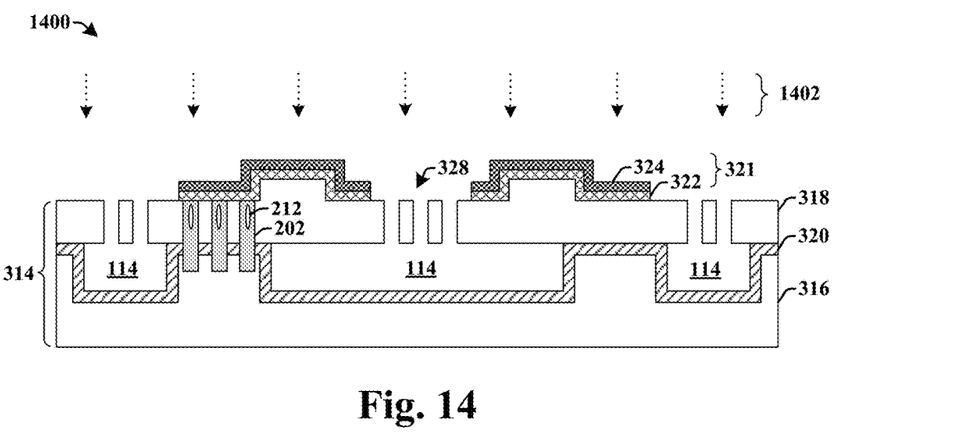

As shown in cross-sectional view 1400, the conductive routing layer 322 and the eutectic bonding layer 324 are patterned to form conductive bonding structures. The conductive bonding structures 321 extend from over the polysilicon vias 202 to over the plurality of protrusions 319. In some embodiments, the MEMS substrate 318 may also be etched to form openings that define an ambulatory element 328 and/or springs (not shown). In some embodiments, the conductive routing layer 322 and the eutectic bonding layer 324 may be patterned by exposing the MEMS substrate 318 to a fourth etchant 1402.

Figure 15:
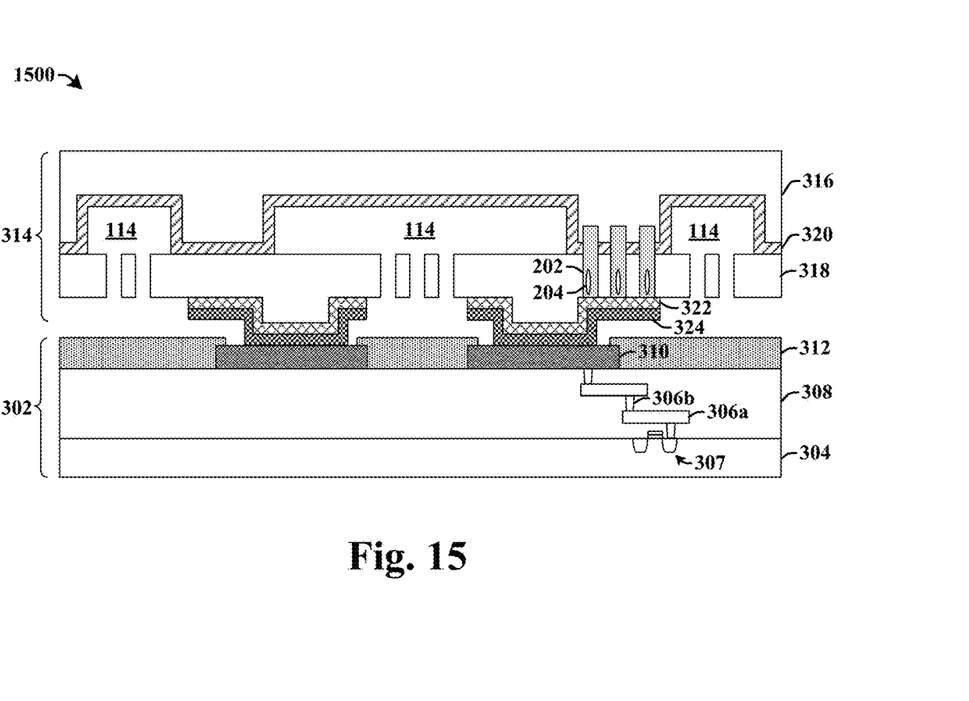

As shown in cross-sectional view 1500, the MEMS structure 314 is bonded to a CMOS substrate 302 having one or more transistor devices 307 arranged within a semiconductor body 304. In some embodiments, the MEMS structure 314 is bonded to the CMOS substrate 302 by way of a eutectic bonding process. The eutectic bonding process bonds the eutectic bonding layer 324 to conductive bond pads 310 arranged on the CMOS substrate 302. The conductive bond pads 310 are in electrical contact with the transistor device 307 arranged within the semiconductor body 304. In some embodiments, the conductive bond pads 310 may comprise aluminum.

Figure 16:
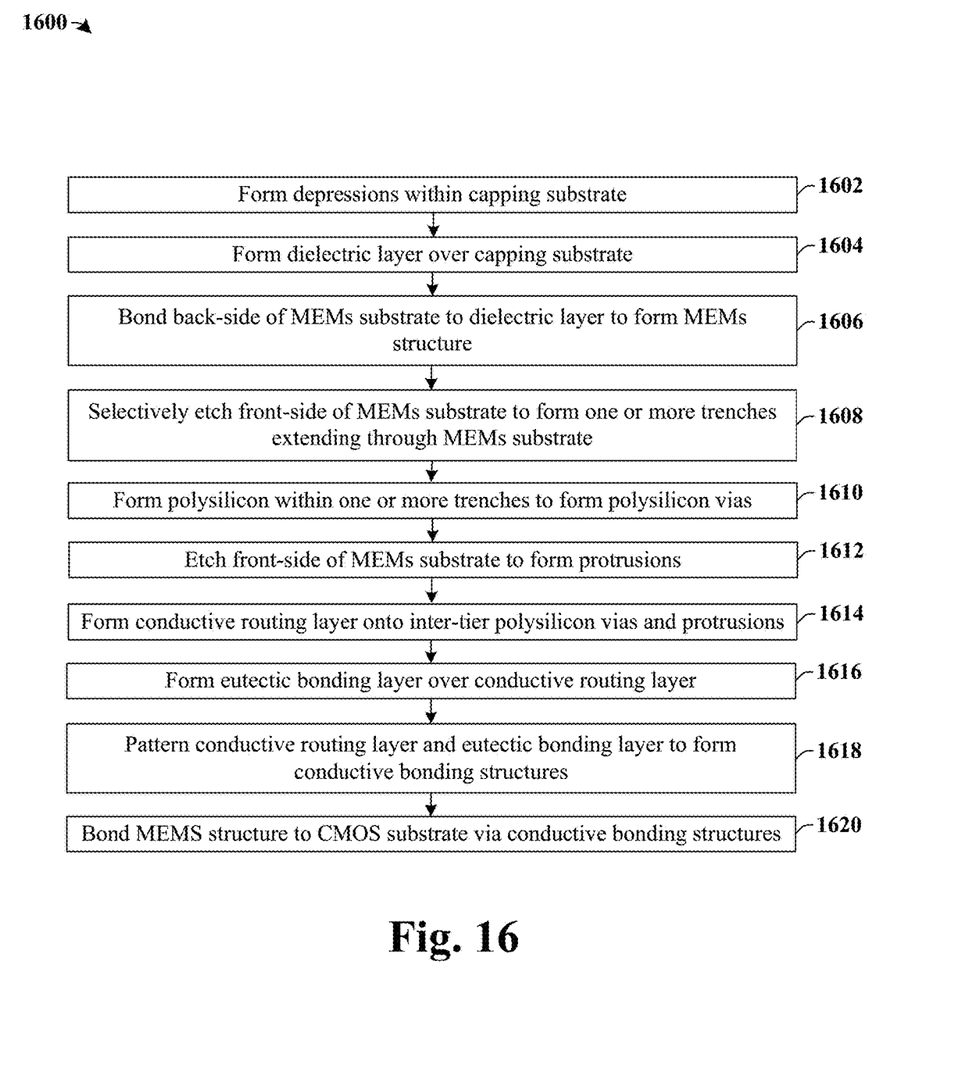
FIG. 16 illustrates a flow diagram of some embodiments of a method of forming a micro-electromechanical system (MEMS) package having an inter-tier polysilicon connection.

FIG. 16 illustrates some embodiments of a method of forming a micro-electromechanical system (MEMS) package having an inter-tier polysilicon connection. Although method 1600 is described in relation to FIGS. 6-15, it will be appreciated that the method 1600 is not limited to such structures, but instead may stand alone as a method independent of the structures.

While the disclosed method 1600 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, one or more depressions are formed within the capping substrate. FIGS. 6-7 illustrate some embodiments of cross-sectional views 600-700 corresponding to act 1602.

At 1604, a dielectric layer is formed over the capping substrate. FIG. 8 illustrates some embodiments of a cross-sectional view 800 corresponding to act 1604.

At 1606, a back-side of a MEMS substrate is bonded to the dielectric layer to form a MEMS structure. FIG. 9 illustrates some embodiments of a cross-sectional view 900 corresponding to act 1606.

At 1608, a front-side of the MEMS substrate is selectively etched to form one or more trenches extending through the MEMS substrate. FIG. 10 illustrates some embodiments of a cross-sectional view 1000 corresponding to act 1608.

At 1610, polysilicon is formed within the one or more trenches to form polysilicon vias extending from the front side of the MEMS substrate to the capping substrate. In some embodiments, the polysilicon may be formed over the front-side of the MEMS substrate and a planarization process may be used remove polysilicon material outside of the trenches. FIG. 11 illustrates some embodiments of a cross-sectional view 1100 corresponding to act 1610.

At 1612, the front-side of the MEMS substrate is selectively etched to form a plurality of protrusions. FIG. 12 illustrates some embodiments of a cross-sectional view 1200 corresponding to act 1612.

At 1614, a conductive routing layer is formed onto the plurality of protrusions and the polysilicon vias. FIG. 13 illustrates some embodiments of a cross-sectional view 1300 corresponding to act 1614.

At 1616, a eutectic bonding layer is formed over the conductive routing layer. FIG. 13 illustrates some embodiments of a cross-sectional view 1300 corresponding to act 1616.

At 1618, the eutectic bonding layer and the conductive routing layer are patterned to form conductive bonding structures. The conductive bonding structures laterally extending from over the protrusions to over the polysilicon vias. FIG. 14 illustrates some embodiments of a cross-sectional view 1400 corresponding to act 1618.

At 1620, the MEMS structure is bonded to a CMOS substrate by way of the bonding structures. The CMOS substrate comprises a plurality of semiconductor devices arranged a semiconductor body. FIG. 15 illustrates some embodiments of a cross-sectional view 1500 corresponding to act 1620.

Therefore, the present disclosure relates to micro-electromechanical system (MEMS) package that uses polysilicon inter-tier connections to provide for a low parasitic capacitance in MEM device signals, and a method of formation.

In some embodiments, the present disclosure relates to a micro-electromechanical system (MEMS) package. The MEMS package comprises a CMOS substrate having one or more semiconductor devices arranged within a semiconductor body, and a MEMS substrate having an ambulatory element. The MEMS substrate is connected to the CMOS substrate by a conductive bonding structure arranged on a front-side of the MEMS substrate at a location that is laterally offset from the ambulatory element. The MEMS package further comprises one or more conductive polysilicon vias extending through the MEMS substrate to the conductive bonding structure.

In other embodiments, the present disclosure relates to a MEMS package. The MEMS package comprises a CMOS substrate having one or more semiconductor devices arranged within a semiconductor body, and a MEMS substrate having an ambulatory element. The MEMS package further comprises a capping substrate having one or more depressions that form one or more cavities arranged between the capping substrate and the MEMS substrate, and an adhesive layer arranged between the MEMS substrate and the capping substrate. The MEMS package further comprises a plurality of polysilicon vias extending through the MEMS substrate from recesses within a surface of the capping substrate facing the MEMS substrate to a conductive bonding structure arranged between the CMOS substrate and the MEMS substrate.

In yet other embodiments, the present disclosure relates to a method forming a MEMS package. The method comprises forming one or more depressions within a capping substrate, and bonding a back-side of a MEMS substrate to the capping substrate to form one or more cavities between the capping substrate and the MEMS substrate. The method further comprises selectively etching a front-side of the MEMS substrate to form one or more trenches extending through the MEMS substrate. The method further comprises forming one or more polysilicon vias within the one or more trenches. The method further comprises forming a conductive bonding structure on the front-side of the MEMS substrate at a location contacting the one or more polysilicon vias, and bonding the MEMS substrate to a CMOS substrate having one or more semiconductor devices by way of the conductive bonding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro-electromechanical system (MEMS) package, comprising:
   a CMOS substrate having one or more semiconductor devices arranged within a semiconductor body;
   a MEMS substrate having an ambulatory element, wherein the MEMS substrate is connected to the CMOS substrate by a conductive bonding structure arranged on a front-side of the MEMS substrate at a location that is laterally offset from the ambulatory element; and
   one or more conductive polysilicon vias extending from the conductive bonding structure completely through the MEMS substrate to protrude outward from a first surface of the MEMS substrate facing away from the CMOS substrate;
   a capping substrate separated from the CMOS substrate by the MEMS substrate and having sidewalls defining one or more depressions within a second surface of the capping substrate facing the MEMS substrate;

a dielectric layer continuously extending from between the MEMS substrate and the capping substrate to line interior surfaces of the one or more depressions, wherein the one or more conductive polysilicon vias extend through the dielectric layer; and wherein the one or more conductive polysilicon vias have sidewalls contacting a first material of the capping substrate and continuously extending between a first end contacting the conductive bonding structure and a second end contacting the first material of the capping substrate.

2. The MEMS package of claim 1, wherein the one or more conductive polysilicon vias extend from the conductive bonding structure to one or more recesses within the second surface of the capping substrate facing the MEMS substrate.

3. The MEMS package of claim 1, wherein the MEMS substrate comprises a plurality of protrusions extending outward from the front-side of the MEMS substrate and contacting the conductive bonding structures, wherein the plurality of protrusions are laterally offset from the one or more conductive polysilicon vias.

4. The MEMS package of claim 3, wherein the one or more conductive polysilicon vias comprise a plurality of polysilicon vias arranged along a same side of one of the plurality of protrusions.

5. The MEMS package of claim 3, wherein the conductive bonding structure comprises:
a conductive routing layer contacting a semiconductor material of the MEMS substrate and extending from over one of the plurality of protrusions to a position contacting the one or more conductive polysilicon vias.

6. The MEMS package of claim 5, wherein the conductive bonding structure further comprises:
a eutectic bonding layer arranged between the conductive routing layer and the CMOS substrate and having sidewalls that are aligned with sidewalls of the conductive routing layer.

7. The MEMS package of claim 1, wherein the one or more conductive polysilicon vias have tapered sidewalls that cause widths of the one or more conductive polysilicon vias to respectively decrease as a distance from the CMOS substrate increases.

8. The MEMS package of claim 1, wherein the one or more conductive polysilicon vias comprise a void having a width that is less than a width of individual ones of the one or more conductive polysilicon vias, and wherein the void is vertically offset from lateral surfaces of the MEMS substrate.

9. The MEMS package of claim 1,
wherein the one or more conductive polysilicon vias respectively surround a void bound by a first surface of the conductive bonding structure and further bound by a second surface of the one or more conductive polysilicon vias; and
wherein the void is laterally separated from the ambulatory element by the MEMS substrate.

10. The MEMS package of claim 8, wherein a top of the void is arranged along a first horizontal plane intersecting sidewalls of the MEMS substrate and a bottom of the void is arranged along a second horizontal plane intersecting the sidewalls of the MEMS substrate, the first horizontal plane and the second horizontal plane parallel to the front-side of the MEMS substrate.

11. The MEMS package of claim 1, wherein the one or more conductive polysilicon vias respectively comprise one or more interior surfaces defining a void completely surrounded by a respective one of the one or more conductive polysilicon vias.

12. The MEMS package of claim 1, wherein the interior surfaces of the one or more depressions comprise the first material of the capping substrate.

13. A micro-electromechanical system (MEMS) package, comprising:
a CMOS substrate having one or more semiconductor devices arranged within a semiconductor body;
a MEMS substrate having an ambulatory element, wherein the MEMS substrate is connected to the CMOS substrate by a conductive bonding structure arranged on a front-side of the MEMS substrate;
one or more conductive polysilicon vias extending from the conductive bonding structure completely through the MEMS substrate to protrude outward from a first surface of the MEMS substrate facing away from the CMOS substrate;
a capping substrate separated from the CMOS substrate by the MEMS substrate, wherein the capping substrate has a plurality of interior surfaces comprising a first material that define a cavity within the capping substrate that is laterally separated from the one or more conductive polysilicon vias by the capping substrate;
a dielectric layer continuously extending from between the MEMS substrate and the capping substrate to line interior surfaces of the cavity within the capping substrate, wherein the one or more conductive polysilicon vias extend through the dielectric layer; and
wherein the one or more conductive polysilicon vias have polysilicon sidewalls contacting the first material of the capping substrate and a polysilicon end contacting the first material of the capping substrate and arranged along a horizontal line that intersects the cavity within the capping substrate, and wherein the polysilicon sidewalls continuously extend between the polysilicon end and the conductive bonding structure.

14. The MEMS package of claim 13, wherein the MEMS substrate define a plurality of protrusions extending outward from the front-side of the MEMS substrate and contacting the conductive bonding structures, wherein the plurality of protrusions are laterally offset from the one or more conductive polysilicon vias by a non-zero distance.

15. The MEMS package of claim 14, wherein the one or more conductive polysilicon vias comprise a plurality of conductive polysilicon vias arranged along a same side of one of the plurality of protrusions.

16. The MEMS package of claim 13, wherein the polysilicon sidewalls of the one or more conductive polysilicon vias directly contact a semiconductor material within the MEMS substrate.

17. The MEMS package of claim 13, wherein the one or more conductive polysilicon vias have tapered sidewalls that cause widths of the one or more conductive polysilicon vias to monotonically decrease as a distance from the CMOS substrate increases.

18. The MEMS package of claim 13,
wherein the one or more conductive polysilicon vias have interior surfaces defining a void having a width that is less than a width of individual ones of the one or more conductive polysilicon vias; and
wherein the width of the void varies as a distance from the conductive bonding structure varies.

19. A micro-electromechanical system (MEMS) package, comprising:

a CMOS substrate having one or more semiconductor devices arranged within a semiconductor body;

a MEMS substrate having an ambulatory element, wherein a front-side of the MEMS substrate is connected to the CMOS substrate by a conductive bonding structure;

a capping substrate separated from the CMOS substrate by the MEMS substrate;

one or more conductive polysilicon vias extending from the conductive bonding structure to the capping substrate;

wherein the one or more conductive polysilicon vias have polysilicon sidewalls contacting a first material of the capping substrate and continuously extending between a first end contacting the conductive bonding structure and a second end contacting the first material of the capping substrate;

wherein the MEMS substrate comprises a protrusion defined by sidewalls of the MEMS substrate that extend outward from the front-side of the MEMS substrate and an upper surface of the MEMS substrate that is between the sidewalls; and wherein the conductive bonding structure has a first surface extending along the front-side and contacting the one or more conductive polysilicon vias, a second surface along the sidewalls, and a third surface along the upper surface.

20. The MEMS package of claim 19, wherein the capping substrate has a plurality of interior surfaces that define a cavity that is laterally separated from the one or more conductive polysilicon vias by the capping substrate; and wherein a dielectric layer continuously extends from between the MEMS substrate and the capping substrate to line one or more of the plurality of interior surfaces; and wherein the one or more conductive polysilicon vias extend through the dielectric layer.

* * * * *